(12) United States Patent
Kälvesten et al.

(10) Patent No.: US 7,172,911 B2
(45) Date of Patent: Feb. 6, 2007

(54) DEFLECTABLE MICROSTRUCTURE AND METHOD OF MANUFACTURING THE SAME THROUGH BONDING OF WAFERS

(75) Inventors: Edvard Kälvesten, Edelcrantzvägen (SE); Thorbjörn Ebefors, Kallkärrsvägen (SE); Niklas Svedin, Karlavägen (SE); Håkan Westin, Prinsgatan (SE)

(73) Assignee: Silex Microsystems AB, Jarfalla (SE)

(*) Notice: Subject to any disclaimer, the term of this patent is extended or adjusted under 35 U.S.C. 154(b) by 0 days.

(21) Appl. No.: 10/504,714

(22) PCT Filed: Feb. 14, 2003

(86) PCT No.: PCT/SE03/00252

§ 371 (c)(1),
(2), (4) Date: Feb. 1, 2005

(87) PCT Pub. No.: WO03/068669

PCT Pub. Date: Aug. 21, 2003

(65) Prior Publication Data

US 2005/0124159 A1    Jun. 9, 2005

Related U.S. Application Data

(60) Provisional application No. 60/356,165, filed on Feb. 14, 2002.

(51) Int. Cl.
*H01L 21/00* (2006.01)
(52) U.S. Cl. ............... 438/29; 438/455; 257/E33.067
(58) Field of Classification Search .......... 438/29, 438/455; 216/2, 36
See application file for complete search history.

(56) References Cited

U.S. PATENT DOCUMENTS

| 5,061,049 | A | | 10/1991 | Hornbeck |
| 5,972,232 | A | * | 10/1999 | Lee et al. ............ 216/24 |
| 6,046,840 | A | | 4/2000 | Huibers |
| 6,071,752 | A | * | 6/2000 | Furlani et al. ......... 438/52 |
| 6,107,115 | A | * | 8/2000 | Atobe et al. .......... 438/72 |
| 6,479,315 | B1 | * | 11/2002 | Zosel et al. .......... 438/69 |
| 6,661,070 | B2 | * | 12/2003 | Zosel et al. .......... 257/420 |
| 6,794,217 | B2 | * | 9/2004 | Lee et al. ............ 438/72 |
| 6,869,815 | B2 | * | 3/2005 | Gasparyan et al. .... 438/29 |
| 6,969,635 | B2 | * | 11/2005 | Patel et al. .......... 438/107 |

(Continued)

FOREIGN PATENT DOCUMENTS

EP    0 552 466    7/1993

(Continued)

*Primary Examiner*—George Fourson
*Assistant Examiner*—John M. Parker
(74) *Attorney, Agent, or Firm*—Young & Thompson (57) ABSTRACT

A method of making a deflectable, free hanging micro structure having at least one hinge member, the method includes the steps of providing a first sacrificial wafer having a single crystalline material constituting material forming the micro structure. A second semiconductor wafer including necessary components for forming the structure in cooperation with the first wafer is provided. Finite areas of a structured bonding material is provided, on one or both of the wafers at selected locations, the finite areas defining points of connection for joining the wafers. The wafers are bonded using heat and optionally pressure. Sacrificial material is etched away from the sacrificial wafer, patterning the top wafer by lithography is performed to define the desired deflectable microstructures having hinges, and subsequently silicon etch to make the structures.

16 Claims, 7 Drawing Sheets

U.S. PATENT DOCUMENTS

| | | | |
|---|---|---|---|
| 6,974,713 B2* | 12/2005 | Patel et al. | 438/29 |
| 7,027,207 B2* | 4/2006 | Huibers | 359/291 |
| 7,049,164 B2* | 5/2006 | Bruner | 438/32 |
| 7,064,879 B1* | 6/2006 | Levitan et al. | 359/224 |
| 7,068,417 B2* | 6/2006 | Yang | 359/291 |
| 7,086,736 B2* | 8/2006 | Collins et al. | 353/30 |
| 2001/0055146 A1* | 12/2001 | Atobe et al. | 359/291 |
| 2002/0117728 A1* | 8/2002 | Borsnihhan et al. | 257/446 |
| 2002/0118429 A1* | 8/2002 | Miyajima et al. | 359/224 |
| 2002/0122239 A1* | 9/2002 | Huibers | 359/291 |
| 2002/0122881 A1* | 9/2002 | Kaeriyama et al. | 427/58 |
| 2003/0054588 A1* | 3/2003 | Patel et al. | 438/107 |
| 2003/0107794 A1* | 6/2003 | Seikkinen et al. | 359/291 |
| 2003/0174929 A1* | 9/2003 | Rodgers et al. | 385/18 |
| 2003/0203530 A1* | 10/2003 | Lee et al. | 438/72 |
| 2005/0054128 A1* | 3/2005 | Gasparayan et al. | 438/29 |
| 2005/0181532 A1* | 8/2005 | Patel et al. | 438/66 |
| 2005/0258133 A9* | 11/2005 | Maynard | 216/2 |

FOREIGN PATENT DOCUMENTS

| | | |
|---|---|---|
| EP | 0 773 436 | 5/1997 |

* cited by examiner

Grounding pad/electrode for mirror, eutectic bumps and frame on bottom substrate Electrode for gimbal drive with pad for wirebonding Grounding pad/electrode

Mirror
Metal
Eutectic (solder) bump
Gimbal structure
Suspension hinge
Electrodes
Cavity
Silicon
Frame
Thermal oxide
Grounding of mirror, eutectic bump and bottom substrate

Fig. 13  DRIE tracks for chip definition

Fig. 14  Temporary carrier wafer / Resolvable attachment film

DEFLECTABLE MICROSTRUCTURE AND METHOD OF MANUFACTURING THE SAME THROUGH BONDING OF WAFERS

This application is a 371 of national stage application of PCT/SE03/00252, Feb. 14, 2003, which claims benefit under 35 USC 119(e) of 60/356,165, Feb. 14, 2002.

TECHNICAL FIELD

The present invention relates generally to processes for the manufacture of free-hanging micro structures, in particular such structures as mirrors for use in Spatial Light Modulation (SLM) devices, by employing mirror arrays.

In particular it relates to novel processes for the manufacture of mirror structures suitable i.a. for SLM.

BACKGROUND OF THE INVENTION

Spatial light modulators (SLM) are transducers that modulate incident light in a spatial pattern corresponding to an electrical or optical input. The incident light may be modulated in its phase, intensity, polarization, or direction, and the light modulation may achieved by a variety of materials exhibiting various electrooptic or magnetoopotic effects and by materials that modulate light by surface deformation. SLMs have found numerous applications in the areas of optical information processing, projection displays, and electrostatic printing. See references cited in L. Hornbeck, 128×128 Deformable Mirror Device, 30 IEEE Tran. Elec. Dev. 539 (1983).

The known beam SLMs have problems including beam insulator charging effects, lack of overvoltage protection against beam collapse, small-angle and nonuniform beam deflection leading to optical inefficiency and nonuniformity, and high voltage addressing of the pixels.

U.S. Pat. No. 6,062,461 discloses a manufacturing method, and is incorporated herein by reference.

Within the semiconductor industry, there are numerous applications that require bonding two or more semiconductor wafers together, an example being semiconductor sensors formed by a silicon wafer (referred to herein as a device wafer) with a micromachined structure or micromachine, which is capped by a second wafer (referred to herein as a capping wafer). Specific examples of semiconductor sensors include yaw (angular rate) sensors, accelerometers and pressure sensors, each of which typically entails a cavity formed in the capping wafer to receive and/or provide clearance for the micromachine of the device wafer. Absolute pressure sensors require that the cavity be evacuated and hermetically sealed, while the performance of yaw sensors and accelerometers with resonating and tunneling micromachines generally benefit if the cavity is evacuated so that the micromachine operates in a vacuum.

The integrity of the bond between the wafers is essential for promoting the life of a semiconductor sensing device. As a result, various bonding techniques have been suggested for the purpose of maximizing the strength and reliability of the bond. For example, the use of adhesives, dielectrics such as glass frit, and solders as intermediate bonding materials have all been suggested in the prior art. Silicon direct and anodic bonding techniques that do not require an intermediate material have also been used. As can be expected, each of these bonding techniques can be incompatible or less than ideal for certain applications. An example of particular interest here is the manufacture of resonating and tunneling micromachines that require a vacuum for improved performance. Silicon direct and anodic bonding methods require very smooth bonding surfaces, and therefore cannot produce a vacuum seal when unplanarized metal crossunders are employed, as is often required to electrically interconnect resonating and tunneling micromachines to bond pads outside the vacuum-sealed cavity of a sensor. In contrast, organic adhesives, glass frit and solder can be used to cover metal steps of up to 21,000 .ANG. found on CMOS, bipolar and BICMOS wafers. However, organic adhesives have not been found to reliably seal micromachines under vacuum, and bonding techniques employing glass frit require temperatures typically in the range of about 385° C. to 410° C., which can cause polysilicon, electroformed metal and LIGA micromachines to warp, bend and/or become electrically unstable. As a further example, yaw sensors with resonating micromachined structures are prone to exhibit zero offset drift, compass effect and start-up drift if subjected to the temperatures necessary to bond wafers with glass frit.

In contrast, solder wafer bonds can be formed at temperatures of 350° C. and less, and have been successfully used to form vacuum seals between wafers having a micromachined structure, as disclosed in U.S. patent application Ser. No. 08/785,683 to Sparks et al., assigned to the assignee of the present invention. Because solder alloys cannot wet or bond to semiconductor materials such as silicon and ceramics, solder wafer bonding requires solderable bond pads adhered to each wafer and to which the solder will metallurgically bond. As shown in Sparks et al., solder bonding of two wafers to form an evacuated cavity requires a pair of complementary solderable rings on the device and capping wafers. A drawback to this requirement is the close alignment tolerances required to align the solderable rings, which complicates the bonding process when performed in a vacuum to obtain an evacuated cavity for housing the micromachine.

From the above, it can be appreciated that improved bonding processes are desired to form a semiconductor sensor having a micromachined structure enclosed in an evacuated cavity and metal crossunders interconnecting the micromachine to bond pads outside of the cavity.

U.S. Pat. No. 5,061,049 discloses a device that overcomes some of the problems associated with the prior art technology. However, there are still some problems, i.a. the Al mirrors are made by deposition processes and are not mono crystalline, and therefore they cannot be perfectly planar, neither on a microscale nor on a macroscale. Polishing will always introduce some surface roughness. Also, the prior art devices are "binary" in their nature, i.e. they are either "on" or "off" (deflected or non-deflected). Furthermore, they all suffer from hysteresis effects to some extent. Finally, the usable wave lengths are restricted to the visible spectrum.

SUMMARY OF THE INVENTION

Thus, there is still room for improvements in the field of devices comprising free-hanging micro structures, such as micro mirrors for SLM, and it is the object of the present invention to provide a novel method for making such free-hanging devices in general, and in particular mirrors and/or arrays, that have superior properties compared to previously known devices. This object is achieved in one aspect with a method according to claim 1.

In one embodiment the method involves the use of eutectic solder material for the bonding of wafers to form well defined structures exhibiting well defined spacing between wafers.

In another embodiment the spacing accuracy is further improved by employing spacing elements.

In a further embodiment the bonding is achieved by utilizing the material in one of the wafers as one component of the eutectic bond.

Further embodiments are defined in additional dependent claims.

In a further aspect, the invention comprises mono-crystalline free-hanging members, e.g. mirrors, preferably made of silicon or other materials that can be processed in a single crystalline state to form micro structures.

The advantages with the novel and inventive method is the ability to manufacture devices exhibiting i.a.

superior mechanical properties (no hysteresis effects);
perfectly planar reflective surface, both with regard to surface roughness and macroscopic planarity (no curving of the surface);
excellent reflective properties, operable with wave lengths down to about 100 nm (deposition of different materials, e.g metals such as gold increases the reflectivity for longer wave lengths 600–2000 nm);
sufficiently intrinsically electrically conductive (doping can be provided during manufacture).

BRIEF DESCRIPTION OF THE DRAWINGS

The invention will be described in detail below with reference to the drawings, in which.

DETAILED DESCRIPTION OF THE INVENTION

For the purpose of the present invention, the terms "eutectic wafer bonding", "eutectic wafer bond", "eutectic bump" and "solder bump", will have the meanings explained below.

Some alloys of metals and semiconductor materials form eutectic compositions that solidifies/freezes at lower temperatures than all other compositions formed by the materials in question. This effect can be used for joining or bonding two different materials together.

A "eutectic bond", is formed when two materials capable of forming a eutectic are brought together in a non-oxidizing environment (under inert gas or in vacuum) while applying heat (and optionally pressure) so as to heat the materials to a temperature above the eutectic point If two wafers (e.g. of single crystalline silicon) on the surfaces of which two or more eutectic materials are present are forced together under pressure and with heat applied, the two materials will form a "eutectic wafer bond". The simplest case is when one eutectic material is provided on a respective wafer. However, a number of other combinations are possible.

Preferred materials for forming eutectic bonds, for the purpose of the present invention, are Au and Si. Thereby, the silicon is provided as the wafer material, and suitably pure silicon wafers are used. Alternatively, wafers of other materials with deposited silicon on the surface can be used. The Au is provided on selected areas or spots, on one or both of the wafers that are to be joined together by bonding (for the purpose of the present invention these areas or spots are referred to as "eutectic bumps", although they consist of a single material and do not form a eutectic alloy until bonding has occurred). However, many other eutectic alloys are known in the art.

The eutectic point of the preferred eutectic bonding of Au—Si is at a temperature of 363° C. When two (silicon) wafers having the suitable Au bumps are heated to this temperature a liquid Au—Si alloy that contains 3% Si and 97% Au is formed. The actual bonding temperature is some tens of degrees higher than the actual eutectic point, which allows sufficient solid-liquid inter-diffusion at the interface. Optionally also a pressure can be used during the bonding, generating the necessary temperature increase to form the eutectic composition. The eutectic alloy then solidifies on cooling and the wafers are thereby bonded together.

The generic term "eutectic bonding", as defined herein, includes the notion of "solder bonding", where two or more materials are deposited on at least one of the wafers which should be bonded together. Commonly used materials, referred to as "solder alloys", include AuSn, PbSn, AgSn, InSn, SbSn. For the purpose of the present invention the preferred alloy is AuSn. Several ways of depositing and structuring these solder alloys are known in art. A solder or "solder bump" or "eutectic bump" is formed when these alloys are heated to the eutectic point forming, so called re-flow. This commonly used definition of a solder is extended for the purpose of the present invention in the same way as for eutectic bumps. This means that also configurations where one of the materials, e.g. Au could be structured on one wafer in solder or eutectic bumps, and then the other material needed to form the eutectic solder, are structured on the other wafer in the same bump configuration, are referred to as "eutectic bumps". This type of bonding is also included in our definition of a solder bonding even though it may differ from the common notion of a solder. The other wafer to be solder bonded will require a soldering area of a material that will wet the solder when they are brought into contact and heated to and above the melting point (=eutectic point) of the solder.

The nomenclature "AuSn" or "AuSi" refers to a mixture (=alloy) of Au and Sn, and Au and Si, respectively. The Au and Sn can be deposited as separate layers with the understanding that the Sn will tend to migrate at elevated temperature into the Au to form the eutectic solder bumps.

However, for ease of manufacturing, the Au/Sn eutectic is preferably deposited as separate layers except in those embodiments where the migration of Sn into Au or Au into Si is specifically relied upon to form eutectic AuSn solder (e.g by a re-flow process), AuSi eutectica, respectively.

One of the important features of the invention is the provision of hinge members for the micro structures, e.g. mirrors, such that the structures are deflectable from a nominal position. The deflection is achieved by electrostatic action through application of voltage across a gap between an electrode (on the bottom wafer) and the structure, e.g. the mirror. The hinge must be defined so as to have a lateral extension or width that is small compared to the width of the structure that is to be deflectable. Preferably, the hinge should have a point of attachment or connection to the deflectable member that is located about the mid point of one edge of said member. In the case of circular structures, or other irregular shapes, the lateral extension of the hinge should be such that a sufficient flexibility is achieved for the electrostatic action to enable said deflection. The actual ratio between the width or extension of the hinge will be a matter of experimentation, that can be performed by the skilled man without undue burden.

The hinges can be achieved in different manners. The basic feature is that a hinge should be thin enough that deflection is easily achieved. If the deflectable structure in itself is sufficiently thin, it will suffice to make the lateral extension of the hinge small enough compared to the width of the structure. If on the other hand the structure is so thick that it renders the structure itself too rigid, the hinge can be made to be thinner, by partially etching through the material at the hinge, such that the part of the structure that is free hanging and the part that is attached to the support is thicker than the hinge member. The hinges can also be defined by making the length of the hinge from the point of attachment on the free hanging, deflectable micro structure, to the point of attachment to its support structure, sufficiently large to render the micro structure deflectable.

In one embodiment there are at least two hinges forming a gimbal structure, so as to render the micro structure deflectable in two directions.

FIGS. 1–5 schematically shows an embodiment of the process according to the invention of assembling two wafers for the purpose of making mirror arrays.

The process comprises making two separate wafers, a first wafer (upper wafer in FIG. 1) carrying the mono/single crystalline materials, e.g. silicon, GaAs, SiC etc, from which the mirrors are to be made, and a second wafer carrying CMOS electronics, electrodes, bond pads and other components necessary for the function of the final array.

Figure 1:
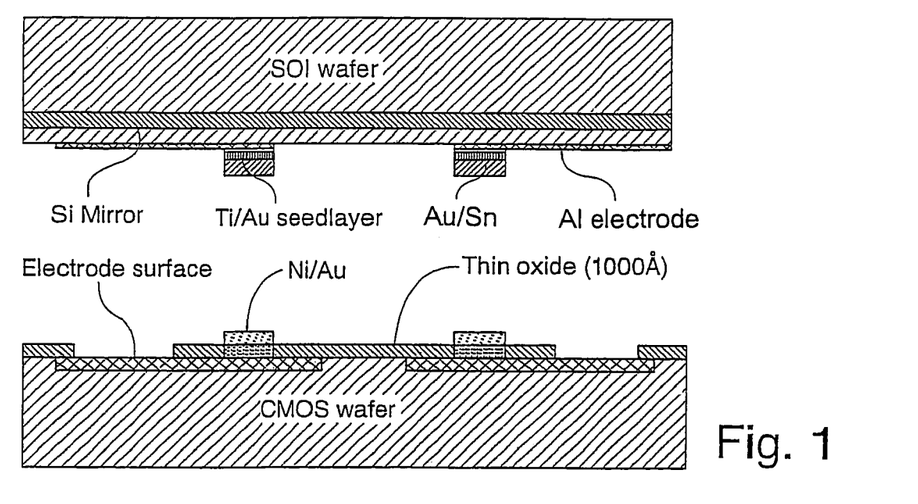
FIG. 1 shows two wafers to be bonded together.

In summary the process can be described as follows:

Making the SOI-wafer (Top-wafer), FIG. 1:
1.—Evaporation Ti/Au for plating base (eg. 100 Å/1000 Å) to cover entire wafer
2.—Lithography and Electroplating solder material, Au/Sn (e.g. 1 µm) in finite bumps and in separate layers
3.—Lithography and Au/Ti etch Making the CMOS or bottom electrode wafer, FIG. 1:
1.—Evaporation (or electroplating (Au), electroless plating (Ni/Au) or sputtering (TiW/Au) a solderable layer (e.g. 100 Å/1000 Å)
2.—Lithography and etch of this solderable layer Bonding of wafers
1.—Wafer bonding (heat to 300° C. and pressure e.g 0.5 bar)
2.—Stripping the thick sacrificial layer of the SOI-wafer (Deep Reactive Ion etch) and a wet HF-etch of oxide layer
3.—Lithography and silicon etch to define the mirrors with hinges Thus, the first wafer (top wafer in FIG. 1) can be a conventional SOI wafer (Silicon On Insulator), commonly used in the semiconductor industry as starting material in numerous applications. However, it is not strictly necessary to employ an SOI, since other etch stop layers are possible. The SOI wafer can be provided with a pattern of Al in thin layers, deposited by e.g. sputtering and defining the final mirrors. However, the provision of Al is not required for the purpose of the invention, and can be dispensed with. For certain applications the single crystalline silicon itself will have a sufficient reflectivity and conductivity to function as mirror/electrode material. If its conductivity must be increased, the silicon wafer can be doped in selected regions according to a desired pattern so as to define the mirrors. In such cases the final mirror elements are produced by masking/etching after bonding the wafers together to form an assembly, as will be described further below.

Solder bumps of the selected solder material (Au/Sn shown) are plated onto the wafer at the desired points, e.g. in at least one point near an edge of the area defining the mirror (see FIG. 1), so as to render the final mirror "beam" cantilevering. The number of bumps may vary depending on the shape of the beam.

The second wafer (bottom wafer in FIG. 1), which can be a CMOS wafer or a plain Si wafer structured or non-structured, comprises electrodes made by depositing suitable electrically conductive materials such as Al, Au, Ni, Ti etc or using highly doped silicon as it is or using a plain or structured wafer with wafer through vias.

There are also provided soldering bumps of e.g. Ni/Au, which is a preferred material, but in no way the only possible. These bumps are disposed in a pattern exactly matching the solder bumps on the first wafer. They are made by electroplating or by electroless plating.

The wafer is suitably partially covered by a thin oxide layer, or a layer of some other non-wetting material, such that the electrodes as well as the Ni/Au bumps are exposed for the purpose of creating different wetting properties on the bumps and the area surrounding them. Also the upper wafer should be provided with non-wetting material surrounding the contact spots with which the solder is to cooperate to form the final bond.

For assembly the two wafers are brought together (FIG. 2) in a non-oxidizing environment (under inert gas or in vacuum) while applying heat (and optionally pressure) so as to melt the solder. When the wafers are aligned, heating is terminated and the solder solidifies.

Figure 2:
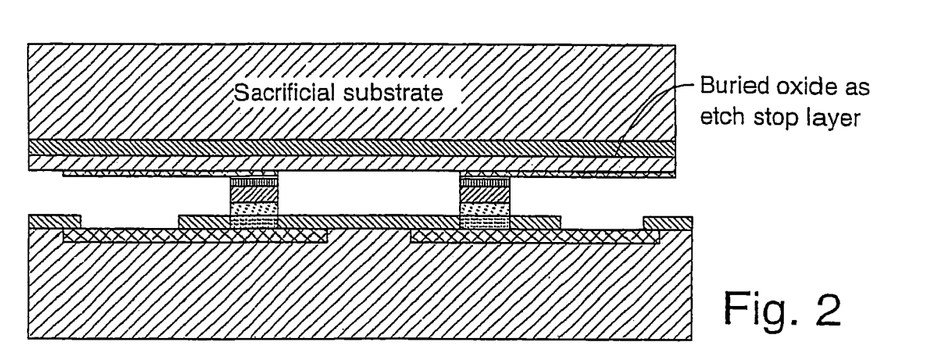
FIG. 2 shows the wafers bonded together.
Figure 3:
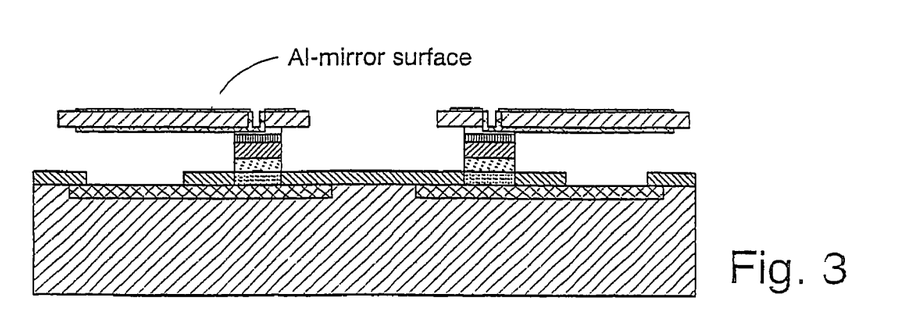
FIG. 3 shows an assembly where mirrors have been created by etching sacrifical material.

When the wafers have been bonded together yielding the structure seen in FIG. 2, the sacrificial layer on the SOI is etched away (wet or dry), and then the oxide is etched away, by dry plasma etc or wet etch, the latter in order to maintain the mirror surface finish.

The silicon layer is patterned by lithographic methods and etched to create the desired beam structure for the mirrors.

Optionally Al is deposited (see FIG. 3) by sputtering, and the definition of the final structures is made by suitable patterning and etching in conventional way.

Finally, the individual chips are self-aligned. This is an important feature of the invention and is performed by making use of the fact that the solder has other wetting properties on the Ni/Au bumps than on the surrounding oxide layer. The self alignment is achieved by cutting out the individual mirror array chips from the wafer assembly, and exposing each of them separately to heat again so as to melt the solder. Thereby the solder will float out to completely cover the Ni/Au bumps, and if there should have occurred a slight misalignment in the wafer bonding process, the two parts of each mirror chip will adjust themselves by this operation.

Another important and advantageous feature of the present invention is that if the Ni/Au bumps are made to exhibit a larger surface area than the matching solder bumps, it will become possible to reduce the spacing between the wafers in the bonding process. Namely, the solder bump, which has a defined height as provided on the upper wafer, will float out on the larger Ni/Au bump, and in the process the height of the Au/Sn bump is of course reduced. This enables a reduced spacing between wafers than what otherwise would be possible, and thus the final mirror can be located closer to the electrode, and with a higher accuracy.

Figure 4:
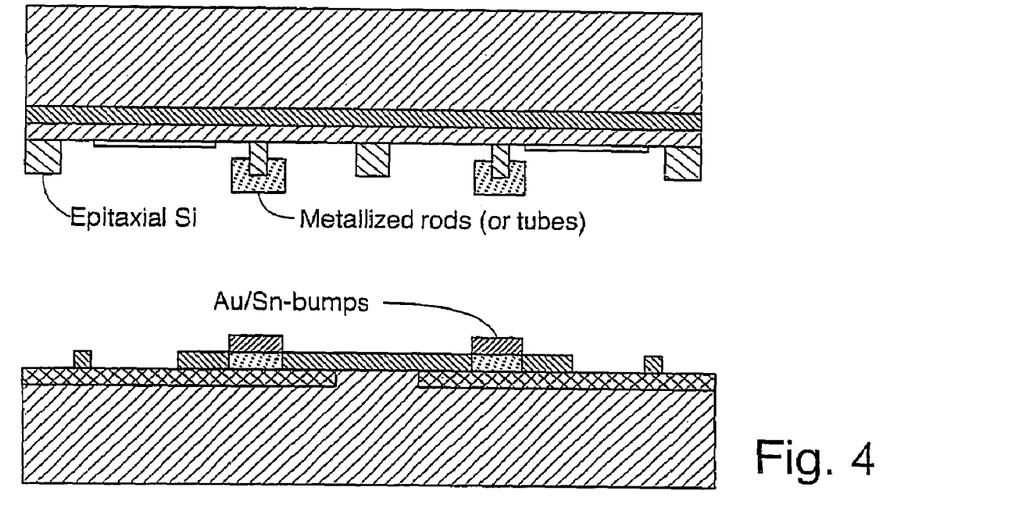
FIG. 4 shows two non-bonded wafers according to an alternative embodiment.
Figure 5:
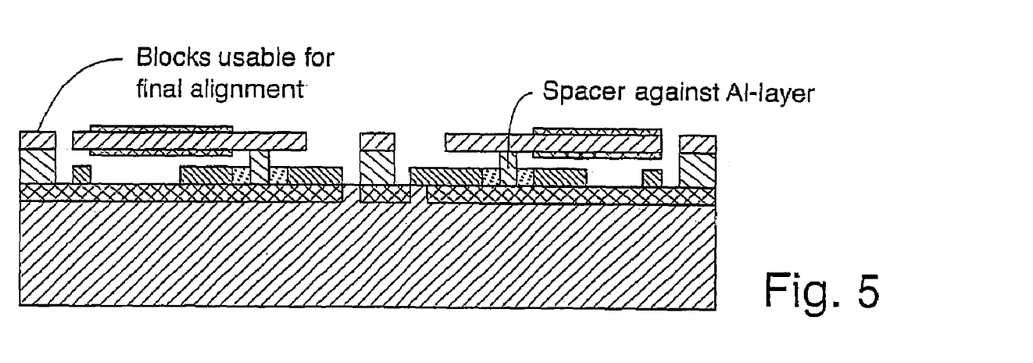
FIG. 5 shows the embodiment of FIG. 4 in a finished state.

FIG. 4 illustrates a further feature of the invention, namely the provision of spacer members defining the distance between mirror and electrode. These spacers are provided on the SOI wafer (first wafer) in alignment with the contact bumps (Ni/Au) on the CMOS wafer (second wafer) and on which there has been provided solder, e.g. Au/Sn. When the wafers are brought together and the heat is applied, the solder melts and spacer members will come into contact with the CMOS wafer, thereby providing an exact definition of the spacing between the wafers, which can be seen in FIG. 5. This corresponds to the arrangement in FIG. 3, wherein the solder itself will define the spacing.

EMBODIMENT 3

Figure 6:
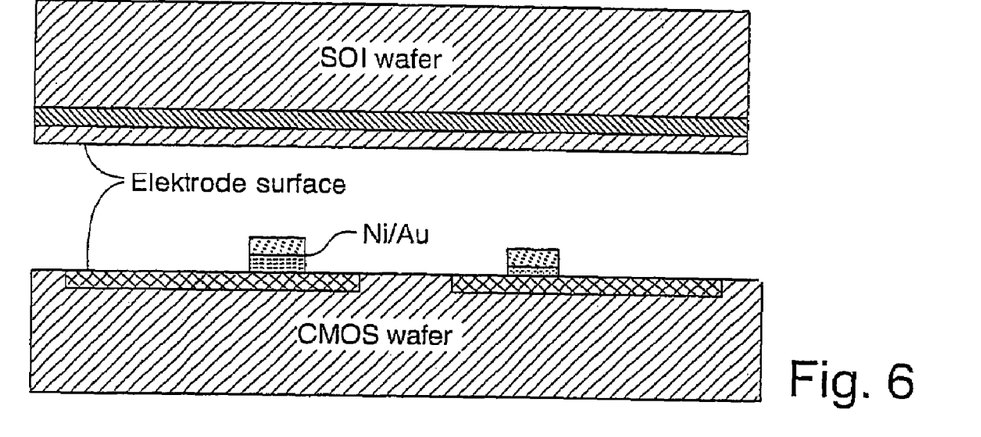
FIG. 6 shows two wafers before bonding according to a further embodiment.
Figure 7:
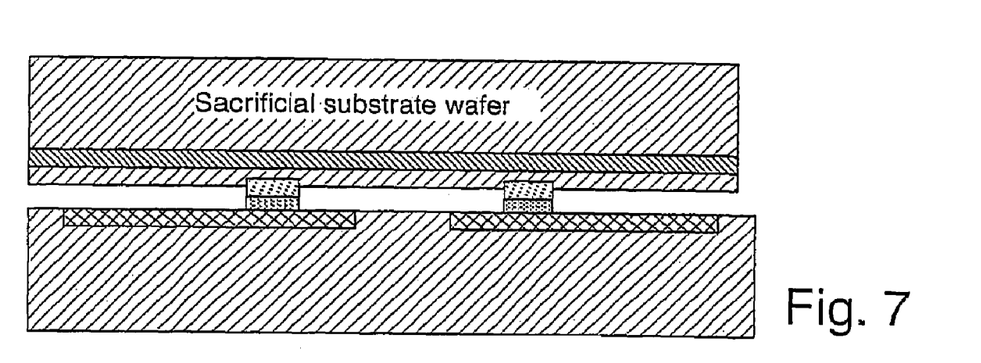
FIG. 7 shows the wafers in FIG. 6 bonded together.
Figure 8:
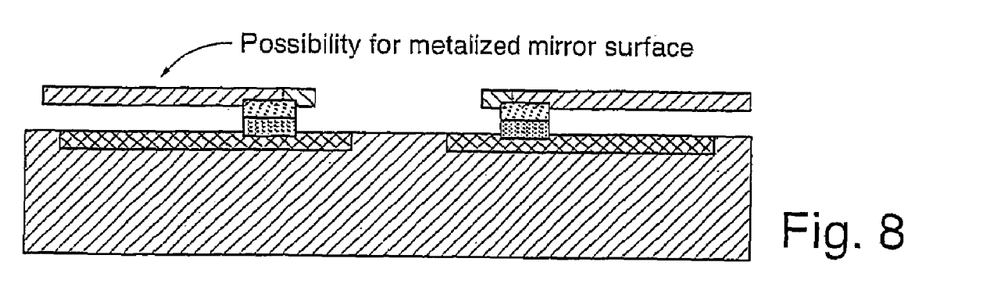
FIG. 8 shows a finished structure.

FIG. 8 schematically shows a third preferred embodiment of the final mirror or mirror arrays device fabricated according to the invention., In summary the process can be described as follows with reference to FIGS. 6–7:

Making the SOI-wafer (Top-wafer) which is then normally is not processed further before the AuSi eutectic bonding. Optionally this wafer can be deposited with a metal layer as mirror electrodes following the processing according to embodiment 1.

The second wafer (bottom wafer in FIG. 6), which can be a CMOS wafer or a plain Si wafer structured or non-structured, comprises electrodes made by depositing suitable electrically conductive materials such as Al, Au, Ni, Ti etc or using highly doped silicon as it is or using a plain or structured wafer with wafer through vias (i.e. electrical connections through the wafer). The bottom wafer is also provided with eutectic bumps (as defined above) of e.g. Ni/Au or TiW/Au, consisting of a diffusion barrier and a top layer of gold. Other eutectic alloys suitable for bonding exists and are known to the skilled man, but our preferred materials are Au bumps bonding to Si, although this is in no way the only possible material. These bumps are disposed in a pattern but must not match any bumps on the first wafer, as in the case for the previously described embodiment. The bumps are made by electroplating, by electro less plating, by evaporation or by sputtering or a combination of these methods.

For assembly the two wafers are brought together in a non-oxidizing environment (under inert gas or in vacuum) without any need for coarse alignment as with the process according to embodiments described above (FIGS. 1–5). This is an important feature of the invention and is performed by making use of the fact that the Au bumps could be directly bonded to the Silicon without any metal layers needing the good wetting property. Applying heat (and optionally pressure) the eutectic phase of the alloy is obtained. At the eutectic point (e.g. at 363° C. for the AuSi alloy), a liquid Au—Si alloy that contains 3% Si and 97% Au is formed. The actual bonding temperature is some tens of ° C. higher than the eutectic point, which allows sufficient solid-liquid interdiffusion at the interface. The eutectic alloy then solidifies on cooling and the wafers are bonded together. In case a metal electrode is used a coarse alignment of the two wafers are needed before the bonding (e.g. the electrodes on respective wafer need to overlap with each other). When the wafers are aligned, heating is terminated and the eutectic bumps solidifies.

When the wafers have been bonded together yielding the structure seen in FIG. 7, the sacrificial layer on the SOI is etched away (wet or dry), and then the oxide is etched away, following the process described above for the previously described embodiment.

The silicon layer is patterned by lithographic methods aligning the mask direct against the patterns (e.g. electrodes or eutectic bumps) on the second wafer (bottom wafer) and etched to create the desired beam/hinge structure for the mirrors. This is an important feature of the invention since it makes use of direct alignment of the mask towards patterns on the wafer (e.g. the conventional method in semiconductor/IC/MEMS manufacturing) rather than relying on the alignment accuracy during bonding. Using the above described feature of direct alignment the mis-alignment compensation techniques of the bonding, by self-alignment feature, used in the previously described embodiments are not needed. The final SLM device is shown in FIG. 8.

Optionally Al is deposited by sputtering, and the definition of the final structures is made by suitable patterning and etching in conventional way.

EMBODIMENT 4

Figure 9:
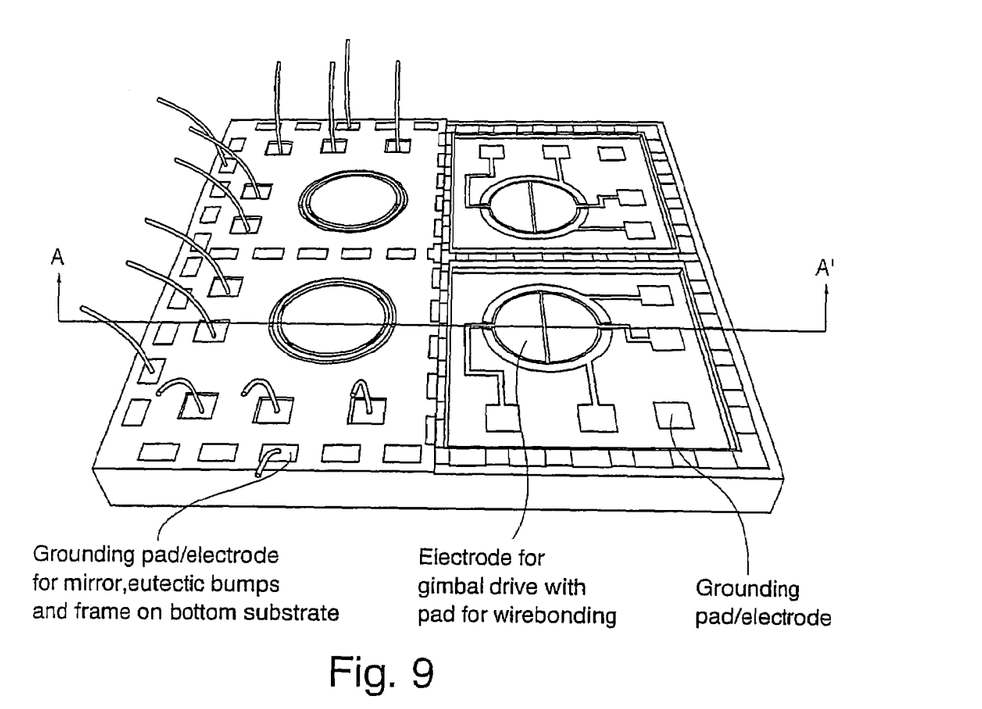
FIG. 9 is a perspective view of a further embodiment of the invention with two non-bonded wafers.
Figure 10:
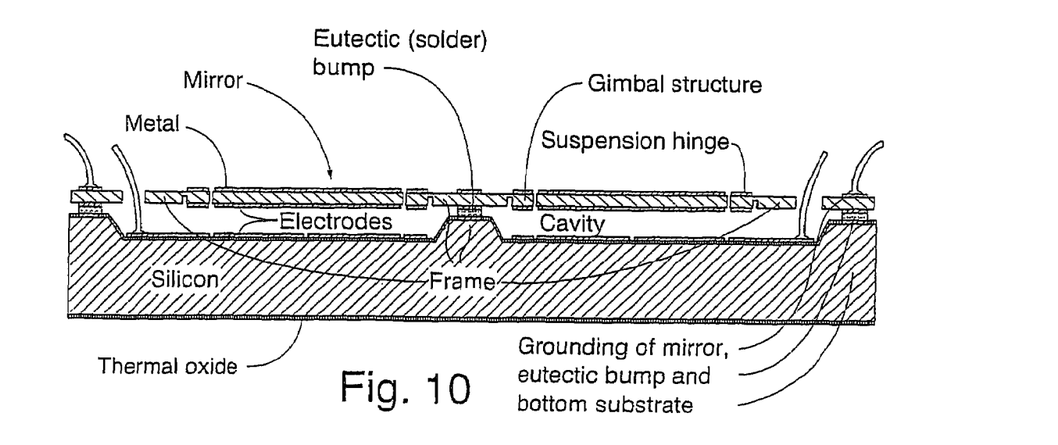
FIG. 10 shows the cross-sectional view A–A' in FIG. 9.

FIG. 9 schematically shows a perspective view of a fourth embodiment of the final mirror or mirror arrays device fabricated according to the invention. For clarity the mirrors and hinge/suspension structures are removed in the right part of the drawing looking into the cavity where the electrodes are shown. FIG. 10 is a cross section at A–A' in FIG. 9.

The process comprises making two separate wafers, a first wafer carrying the mono/single crystalline materials, e.g. silicon, GaAs, SiC etc, from which the mirror(s) are to be made, and a second wafer carrying components necessary for the function of the final mirror device such as electrodes, bond pads, via contacts, CMOS electronics. Then the two wafers are bonded together using an eutectic bonding method according to the present invention.

In summary the process can be described as follows:
Making the SOI-wafer (Top-wafer, FIG. 11):
1.—Evaporation or sputtering of thin layers of Ti/Au as electrode structures. Also the eutectic bumps used for bonding spots are defined in this step.
2.—Lithography and Si etch (preferably dry plasma DRI-etching) forming hinge structures. (not necessary)

Making the bottom electrode wafer (FIG. 11):
3.—Etching of cavities (not necessary), oxidation, (opening of contact holes for grounding the substrate), Metal deposition of a seed-layer.

Figure 12:
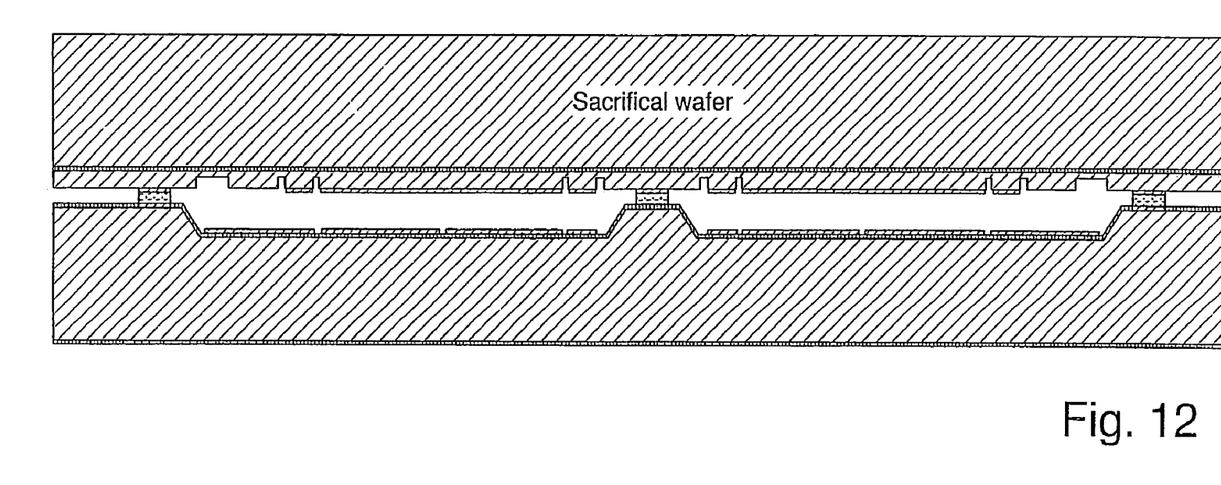
FIG. 12 shows the embodiment of FIG. 9-10 with the wafers bonded together using an eutectic bond.

4.—Lithography (lift-off or plating mold) and deposition of an eutectic structure (Au/Sn as an example of solder or only Au as an eutectic sublayer) by evaporation, sputtering or electroplating (thickness 0.5–10 μm), 5.—Lithography and etch of the seed-layer used to define the electrode patterns Bonding of wafers (FIG. 12):

6.—Wafer bonding (heat above 363 C and pressure e.g 0.5 bar for eutectic bonding with Au bumps direct to Si or heat above 283 C for AuSn—Au solder bonding)

7.—Lithography and etch of oxide and silicon to define die tracks from backside on bottom wafer to define and later separate each component, the top wafer is used as a robust carrier wafer 8.—Mounting to a temporary carrier wafer using resolvable tapes or other adhesives such as resist 9.—Stripping the thick layer of the SOI-wafer (Deep Reactive Ion etch) and a wet HF-etch of oxide layer 10.—Metal deposition, lithography and metal etch to define the reflective part of the mirrors 11.—Lithography and silicon etch to define the mirrors with hinges as well as die tracks.

12.—Removal from the temporary carrier wafer (e.g. release of the adhesive material either by heating the wafer for removal of the tape or solvent cleaning to remove the resist) then final individual mirror devices according to this invention are finished.

Thus, the first wafer (top wafer in FIG. 11) can be a conventional SOI wafer (Silicon On Insulator), commonly used in the semiconductor industry as starting material in numerous applications. However, it is not strictly necessary to employ an SOI, since other etch stop layers are possible. The SOI wafer can be provided with a pattern of a thin metal layer, deposited by e.g. sputtering or evaporation and defining the final mirror electrodes as well as the eutectic bumps defining the bonding areas later on. However, the provision of the metal layer is not required for the purpose of the invention, and can be dispensed with. For certain applications the single crystalline silicon itself will have a sufficient reflectivity and conductivity to function as mirror/electrode material. If the conductivity must be increased, the silicon wafer can be doped in selected regions according to a desired pattern so as to define the mirror electrodes. In such cases the final mirror elements are produced by masking/etching after bonding the wafers together to form an assembly, as described above. For certain eutectic bonding alloys (e.g. Au—Si) the top whole single crystalline surface is used as the bonding areas. Then no eutectic bumps are needed. To minimize any bimorph effects coming from unsymmetrical mirrors which could create mirror curvature the same material and thickness should be used both for electrodes and later on as the reflective material on the other side of the mirror. Therefore the choice of material is dependent on which wavelengths the mirror should reflect. For some applications the electrode material isn't suitable as eutectic bumps then the deposition and photolithography patterning of the electrodes and the eutectic bumps have to be made in two separate steps.

Optionally the top wafer could be photolithography patterned and silicon etched to a certain depth into the SOI wafer to form optimum hinges, gimbals and suspension springs, via structures (partially through) or other structures. Including this etching step the mirrors remain thicker, e.g. exhibiting less curvature, while the become softer and thus easier to actuate.

When solder bonding should be used the top wafer is suitably partially covered by a thin oxide layer, or a layer of some other non-wetting material, such that the electrodes as well as the Ni/Au bumps (e.g. bonding spots with which the solder is to cooperate to form the final bond) are exposed for the purpose of creating different wetting properties on these spots and the area surrounding them. Also the bottom wafer should be provided with non-wetting material surrounding the solder bumps.

Figure 11:
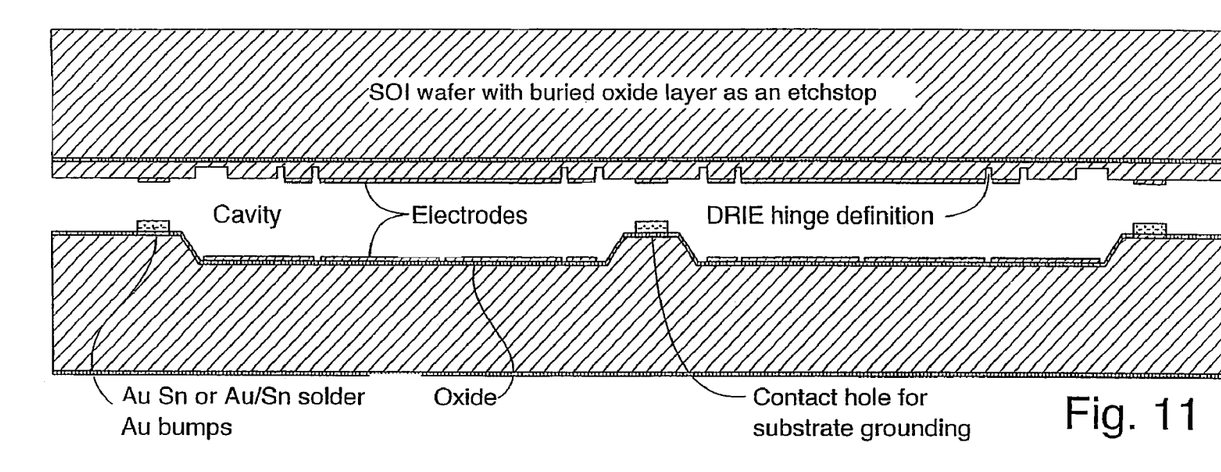
FIG. 11 shows the two wafers of the embodiment of FIGS. 9–10 before bonding the wafers together.

The second wafer (bottom wafer in FIG. 11), which can be a structured or non-structured plain Si wafer or a CMOS wafer or a wafer with wafer-through vias, comprises electrodes made by depositing suitable electrically conductive materials such as Al, Au, Ni, Ti, TiW etc. or doped silicon areas. To increase the tilting angle of the mirrors a cavity could be formed under the mirror(s) by wet e.g. KOH or dry plasma DRI-etching. Then an insulation layer e.g. oxide is needed before the metallization of the electrodes. By opening up contact holes through this oxide grounding the substrate by special grounding electrodes/pads could be achieved and also the eutectic bumps could be grounded. Then a deposition of a seed-layer is performed. Our preferred seed-layer consists of an adhesion layer (e.g. Ti or Cr) and a diffusion barrier (e.g. Ni, Pt, TiW) and then a gold layer provided by evaporation (or electroplating (Au), or electroless plating (Ni/Au), or sputtering (TiW/Au or combination of these with a typical thickness of 100 Å/1000 Å/4000–10.000 Å). The final gold layer should to be thick enough for wire bonding. However, other materials are of course possible Eutectic bumps of the selected material are deposited onto the bottom wafer at the desired points, e.g. on a frame around the mirrors as illustrated in FIGS. 9 and 11. The number of bumps may vary depending on the size of the mirrors. However, it is not strictly necessary to employ a frame with eutectic bonding materials between each mirror, also other attachment/suspension configurations are possible.

Our two preferred eutectic bumps are Ni/Au (for Au—Si eutectic bonding) or AuSn (for AuSn—Au solder bonding), but these are in no way the only possible choices for eutectic bonding. These bumps are disposed in a pattern exactly matching the bonding contact areas Ni/Au for solder bonding) on the top wafer but for the case of Au—Si eutectic bonding the Au bumps on the bottom wafer don't need to fit with bumps on the top wafer since the whole wafer consist of bonding areas. However, when metallized electrodes are used on the top wafer the two wafers need to be aligned to each other in a way that the electrodes on respective wafer overlap with each other. The bumps on the bottom wafer are preferably made by electroplating (Au or Au/Sn) but also electroless plating (Au) or sputtering (Au) or evaporation (Au or Au/Sn), screen-printing (AuSn) as well as other metalisation methods can be used.

For assembly the two wafers are brought together in a non-oxidizing environment (under inert gas or in vacuum). Applying heat (and optionally pressure) the eutectic phase of the alloy is obtained. At the eutectic points (e.g. at 363° C. for the AuSi alloy or 282° C. for the AuSn alloy), a liquid alloy is formed. The actual bonding temperature is some tens of ° C. higher than the eutectic points, which allows sufficient solid-liquid interdiffusion at the interface. The eutectic alloy then solidifies on cooling and the wafers are bonded together. When the wafers are aligned, heating is terminated and the eutectic bumps solidifies and a solid assembly of the two wafers into one robust wafer package is formed as shown in FIG. 12.

Figure 13:
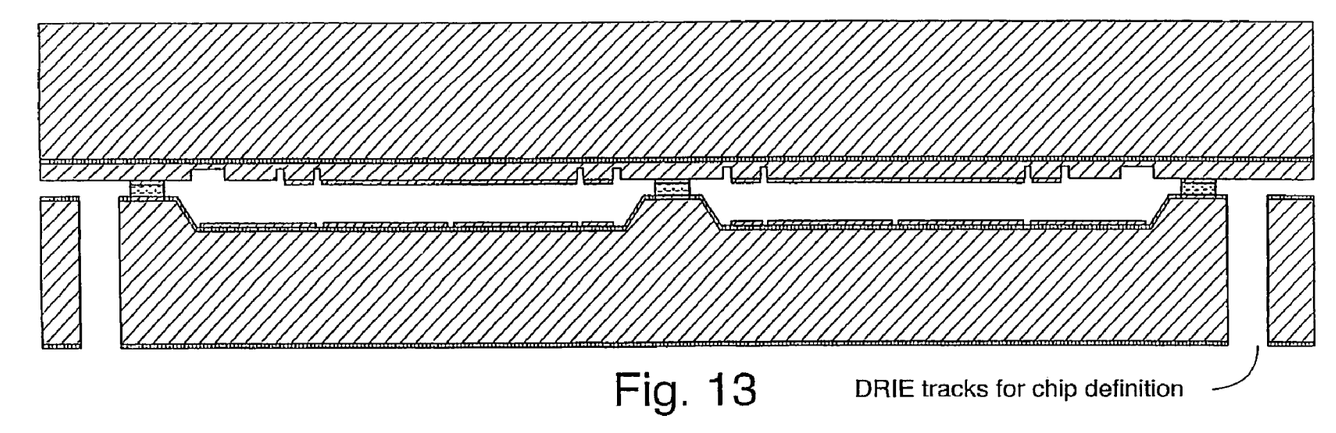
FIG. 13 shows the dicing of the bottom wafer, the top wafer is used as a carrier/support wafer.

When the wafers have been bonded together yielding the structure seen in FIG. 12, the backside of the bottom wafer is photolithography patterned followed by oxide and silicon etching to define die tracks for later separation of the different dies on the wafer into individual free dies. The silicon etch (preferable dry DRIE) stops on the oxide on the front side of this wafer. The top wafer is used as a robust carrier wafer as shown in FIG. 13.

Figure 14:
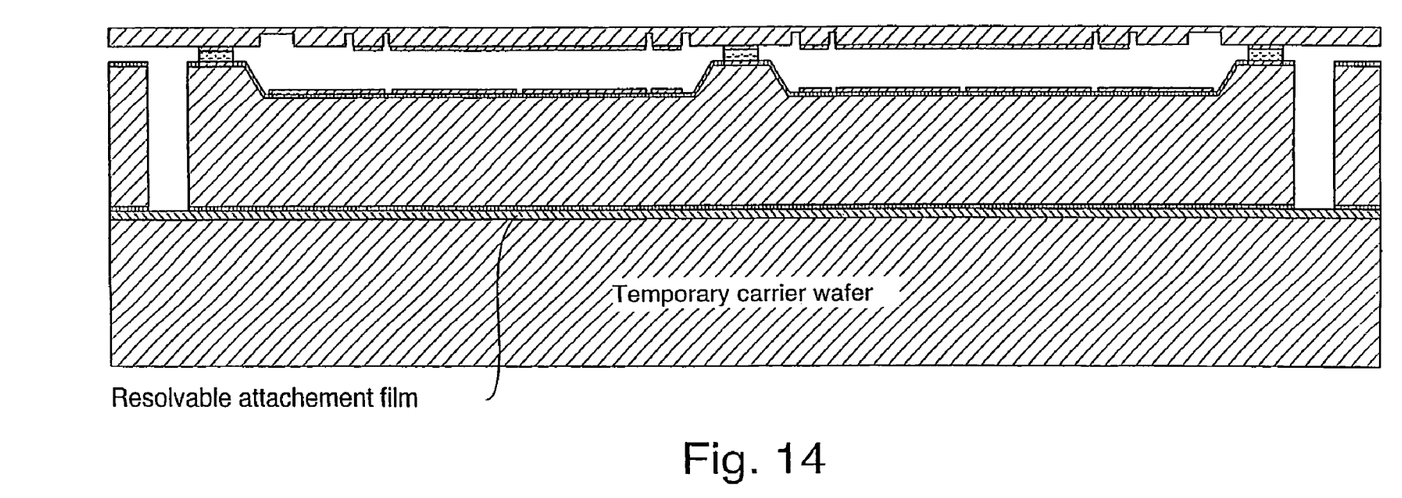
FIG. 14 shows an assembly where a temporary carrier wafer is used, and wherein the top wafer has been sacrificially removed.

The two bonded wafers (one package) is then mounted on a temporary carrier wafer using some adhesive materials (resolvable tapes, resist, etc). When the wafers have been bonded together and mounted on the temporary carrier wafer yielding the structure seen in FIG. 14, the sacrificial layer on the SOI is etched away (wet or dry), and then the oxide is etched away, by dry plasma etc or wet etch, the latter in order to maintain the mirror surface finish.

Optionally a reflective material (preferably the same material, processing method and thickness as for the electrode on the other side of the mirror to achieve a flat mirror) is deposited by sputtering or evaporation, and the definition of the final reflective mirror area is made by suitable patterning and etching in conventional way. To minimize the amount of photolithography masks the same mask could be used for the lithography of the electrodes and solder spots (on bottom side of the SOI wafer) as for the reflective mirrors (on the top side of the SOI wafer after sacrificial removal of the carrier substrate).

Figure 15:
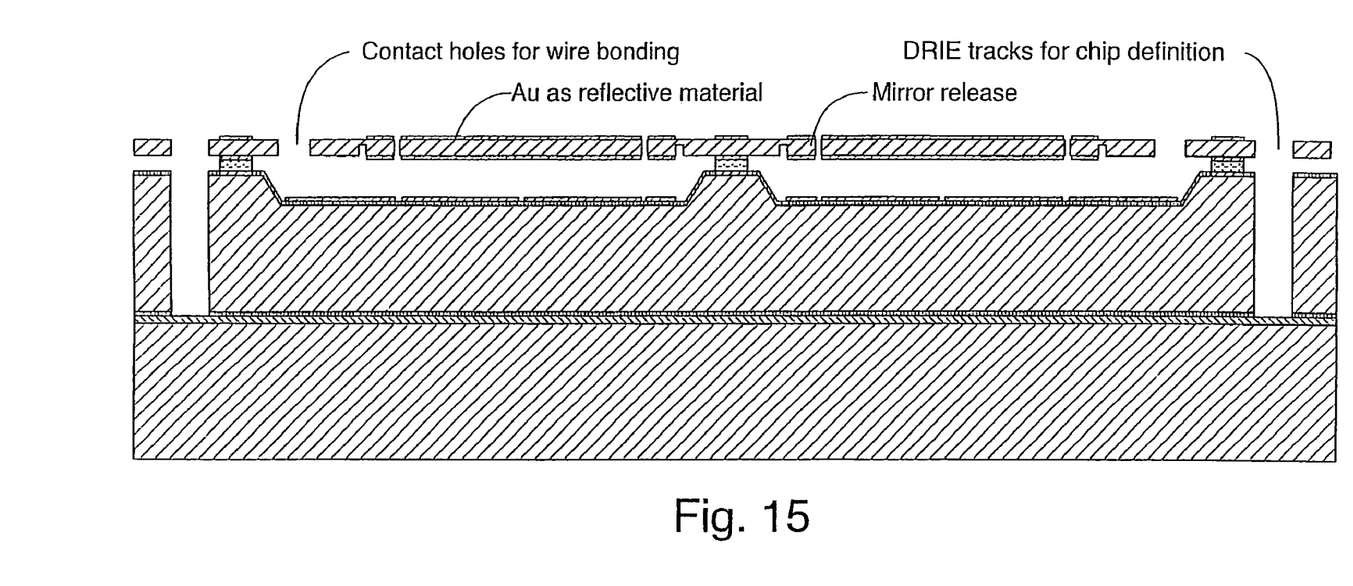
FIG. 15 shows an assembly where reflecting mirrors have been created by metal deposition and the suspension and hinges as well as the device itself (e.g. dicing tracks) are defined by etching according to a third embodiment.

The silicon layer is patterned by lithographic methods and etched to create the desired hinge structure for the mirrors as shown in FIG. 15.

Figure 16:
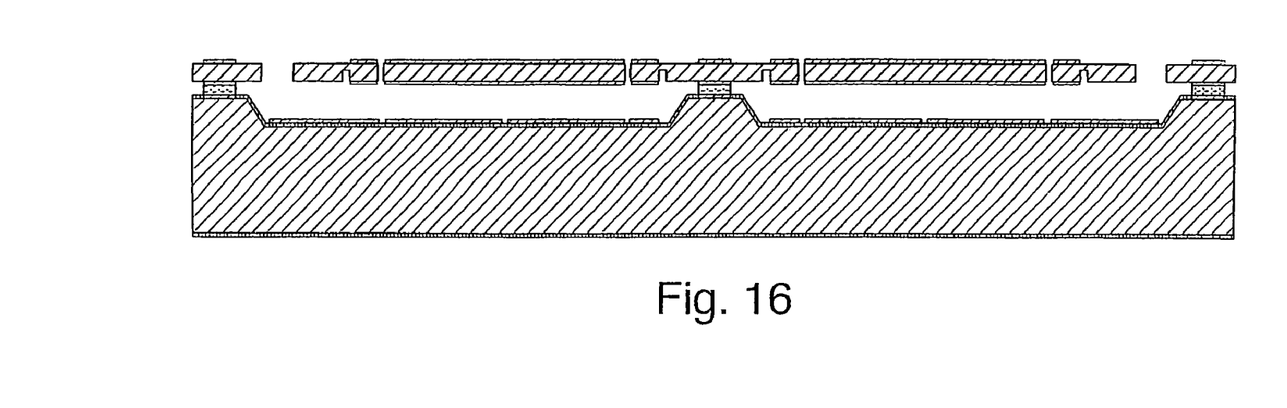
FIG. 16 shows the final diced mirror device released from the temporary carrier wafer according to a third embodiment.

Finally, the individual chips are released from the temporary carrier wafer by release of the adhesion layer. A single finished structure is shown in FIG. 16.

Optionally, the individual chips could be self-aligned in the same way as already described for embodiment 1. Also the use of larger Ni/Au bumps than the AuSn solder could be used to reduce the height of the bonding bumps for closer vertical distance between the electrode areas in the same way as described above in embodiment 1.

EMBODIMENT 5

Similiar structure as embodiment 4 but placing the solder on top wafer and contact areas on the bottom wafer (as embodiment 1 but with the final structure according to embodiment 4).

EMBODIMENT 6

Similar structure as embodiment 4 but bonding Silicon rods (epitaxial grown or defined by etching on bottom wafer) bonding to an Au eutectic bump on the top wafer.

Finally, the individual chips are self-aligned. This is an important feature of the invention and is performed by making use of the fact that the solder has other wetting properties on the Ni/Au bumps than on the surrounding oxide layer. The self alignment is achieved by cutting out the individual mirror array chips from the wafer assembly, and exposing each of them separately to heat again so as to melt the solder. Thereby the solder will float out to completely cover the Ni/Au bumps, and if there should have occurred a slight misalignment in the wafer bonding process, the two parts of each mirror chip will adjust themselves by this operation.

Another important and advantageous feature of the present invention is that if the Ni/Au bumps are made to exhibit a larger surface area than the matching solder bumps, it will become possible to reduce the spacing between the wafers in the bonding process. Namely, the solder bump, which has a defined height as provided on the upper wafer, will float out on the larger Ni/Au bump, and in the process the height of the Au/Sn bump is of course reduced. This enables a reduced spacing between wafers than what otherwise would be possible, and thus the final mirror can be located closer to the electrode, and with a higher accuracy.

The invention claimed is:

1. A method of making one or more micro mirror(s), comprising the following steps:
   providing a first semiconductor wafer and a second semiconductor wafer;
   depositing eutectic/solder bumps on the first wafer and contact areas/bumps on the second wafer or on both;
   bringing the wafers together while applying heat to form an assembly with an eutectic bond;
   cooling the assembly to solidify the eutectica to provide spacer members between the wafers;
   using lithographic and etching techniques to make single crystalline mirrors cantilevering from said spacer members.

2. The method as claimed in claim 1, comprising:
   within said first wafer is a sacrificial top wafer provided by
   evaporating Ti/Au to form a plating base covering the entire wafer;
   patterning by lithography and electroplating solder material, preferably Au and Sn in finite bumps and in separate layers,
   patterning by lithography and Au/Ti etch to remove excess Au/Ti
   providing said bottom electrode wafer by
   evaporating or electroplating Au, electro less plating Ni/Au or sputtering TiW/Au to form a solderable layer;
   patterning by lithography and etching this solderable layer;
   bonding the wafers by
   heating and optionally applying pressure;
   stripping the sacrificial layer of the top wafer and the oxide layer
   patterning by lithography to define the desired microstructures having said hinges, and subsequently silicon etch to make the structure.

3. The method as claimed in claim 1, comprising providing the top wafer with a pattern of Al in thin layers, deposited by e.g. sputtering and defining mirrors.

4. The method as claimed in claim 1, wherein the single crystalline silicon of the top wafer itself has a sufficient reflectivity and conductivity to function as mirror or a electrode material.

5. The method as claimed in claim 1, wherein the silicon wafer is doped in selected regions according to a desired pattern so as to define mirrors.

6. The method as claimed in claim 1, comprising providing solder bumps of a selected solder material by plating onto the wafer at desired points, suitably in at least one point near an edge of the area defining a mirror, so as to render the final mirror cantilevering.

7. The method as claimed in claim 1, comprising making electrodes on the bottom wafer by depositing suitable electrically conductive materials such as Al, Au, Ni, Ti or using highly doped silicon as it is.

8. The method as claimed in claim 1, comprising providing soldering bumps in a pattern exactly matching solder bumps on the top wafer, suitably by electroplating or by electroless plating.

9. The method as claimed in claim 1, comprising partially covering the bottom wafer with a thin oxide layer, or a layer of some other non-wetting material, such that the electrodes as well as the Ni/Au bumps are exposed for the purpose of creating different wetting properties on the bumps and the area surrounding them, and providing also the upper wafer with non-wetting material surrounding the contact spots with which the solder is to cooperate to form the final bond.

10. the method of claim 1, wherein,
said step of bringing the wafers together while applying heat further includes applying a pressure.

11. A micro mirror made by the method of claim 1.

12. A method of making a micro mirror, comprising the steps of:
providing a first semiconductor wafer carrying a micro mirror crystalline material layer;
providing a second semiconductor wafer;
depositing eutectic solder bumps on the first wafer by sequentially i) evaporation of Ti/Au to form a plating base covering the first wafer, ii) lithographing and electroplating a solder material in finite bumps and in separate layers, and iii) performing lithography and a Au/Ti etch;
depositing contact areas on the second wafer by sequentially i) applying Au, ii) applying a solderable layer, and iii) lithographing and etching of the applied solderable layer;
forming an eutectic bond by bonding an assembly of the first and second wafers while heating the first and second wafers to 300° C. at a pressure of 0.5 bar, said heating forming an liquid eutectica of the solder material;
cooling the assembly to solidify the eutectica to provide spacer members between the first and second wafers; and
using lithography and etching of the first wafer to make crystalline mirrors hingedly cantilevered from said spacer members, said mirrors being etched from the micro mirror crystalline material layer.

13. The method of claim 12, wherein, the first wafer is a Silicon On Insulator wafer,
the micro mirror crystalline material layer comprises a single crystalline material,
after etching of the first wafer to make the mirrors, the Au/Sn solder material of the first wafer remains at an edge of an area defining each mirror so as to form a final mirror beam cantilever.

14. The method of claim 13, wherein,
the second wafer is one of a CMOS wafer and a non-CMOS Si wafer.

15. The method of claim 12, wherein,
the micro mirror crystalline material layer comprises a single crystalline material,
after etching of the first wafer to make the mirrors, the Au/Sn solder material of the first wafer remains at an edge of an area defining each mirror so as to form a final mirror beam cantilever,
said step of forming an eutectic bond brings the first and second wafers together in a non-oxidizing environment in one of an inert gas and in vacuum, while the heating melts the solder and forms the liquid eutectica.

16. A method of making a micro mirror, comprising the steps of:
providing a first semiconductor wafer carrying a micro mirror material layer;
providing a second semiconductor wafer;
depositing eutectic solder bumps on the first wafer;
depositing further solder bumps on the second wafer;
forming an eutectic bond between the first and second wafers by bonding an assembly of the first and second wafers while heating the first and second wafers to an eutectic point of the solder bumps to form an liquid eutectica from the solder bumps;
cooling the assembly to solidify the eutectica to provide spacer members between the first and second wafers; and
etching of the first wafer to define crystalline mirrors cantilevered from said spacer members, said mirrors being etched from the micro mirror material layer.

* * * * *